United States Patent
Watanabe et al.

(10) Patent No.: US 7,570,467 B2
(45) Date of Patent: Aug. 4, 2009

(54) ELECTROSTATIC PROTECTION CIRCUIT

(75) Inventors: Kentaro Watanabe, Kawasaki (JP); Hiroyuki Yoshinaga, Saitama (JP)

(73) Assignee: Kabushiki Kaisha Toshiba (JP)

( * ) Notice: Subject to any disclaimer, the term of this patent is extended or adjusted under 35 U.S.C. 154(b) by 384 days.

(21) Appl. No.: 11/237,149

(22) Filed: Sep. 27, 2005

(65) Prior Publication Data

US 2006/0109595 A1    May 25, 2006

(30) Foreign Application Priority Data

Sep. 29, 2004   (JP)   ............................. 2004-284153

(51) Int. Cl.
*H02H 9/00* (2006.01)
(52) U.S. Cl. ........................ 361/56; 361/111
(58) Field of Classification Search .................... 361/56, 361/111
See application file for complete search history.

(56) References Cited

U.S. PATENT DOCUMENTS

| | | | | |
|---|---|---|---|---|
| 5,530,612 A | * | 6/1996 | Maloney | 361/56 |
| 5,821,572 A | * | 10/1998 | Walker et al. | 257/107 |
| 6,002,568 A | * | 12/1999 | Ker et al. | 361/111 |
| 6,258,634 B1 | * | 7/2001 | Wang et al. | 438/133 |
| 6,524,893 B2 | * | 2/2003 | Kawazoe et al. | 438/133 |
| 6,690,557 B2 | * | 2/2004 | Hung et al. | 361/56 |
| 6,969,891 B1 | * | 11/2005 | Leroux | 257/355 |

FOREIGN PATENT DOCUMENTS

JP          05-267589          10/1993

* cited by examiner

*Primary Examiner*—Rexford N Barnie
*Assistant Examiner*—Nicholas Ieva
(74) *Attorney, Agent, or Firm*—DLA Piper LLP (US)

(57) ABSTRACT

An electrostatic protection circuit being an integrated circuit on a semiconductor substrate and including a first power supply terminal having a predetermined potential VDD, a second power supply terminal having a lower potential VSS than the predetermined potential, and an input/output terminal for a signal, the electrostatic protection circuit including: a first and second diodes having the respective cathode electrodes thereof connected in series at a first common connection point between the first power supply terminal and input/output terminal; a third and fourth diodes having the respective anode electrodes thereof connected in series at a second common connection point between the second power supply terminal and input/output terminal; a first discharge element, connected between the first and second common connection points, for discharging excessive static electricity; and a second discharge element, connected between the first and second power supply terminals, for discharging excessive static electricity.

20 Claims, 8 Drawing Sheets

IN CASE OF P-TYPE Si SUBSTRATE

ELECTROSTATIC PROTECTION CIRCUIT

CROSS REFERENCE TO RELATED APPLICATIONS

This application claims benefit of priority under 35 USC §119 to Japanese Patent Application No. 2004-284153 filed on Sep. 29, 2004, the entire contents of which are incorporated by reference.

BACKGROUND OF THE INVENTION

1. Field of the Invention

The present invention relates to electrostatic protection circuits, and more particularly to an electrostatic protection circuit having the input capacitance thereof lowered using a protection element which protects a semiconductor device from the flowing-in of a surge or the like.

2. Related Art

An electrostatic protection circuit is generally connected between a first power supply terminal and second power supply terminal having a lower potential than the first power supply terminal, and is constituted of diodes, etc. connected in plural stages from an anode in the second power supply terminal side to a cathode in the first power supply terminal side. To an intermediate connection point of the plural stages of diodes, there is connected the connection point between an input/output terminal and internal circuit. When the circuit is configured in this way, even when a surge of any polarity (positive or negative) is introduced between any two terminals, a path for discharging the surge is formed.

In such configuration, there parasitically exist junction capacitances of diodes between the input/output terminal and first power supply terminal and between the input/output terminal and second power supply terminal. Consequently, for an input/output terminal which inputs and outputs high-speed signals, the waveform of a signal is deteriorated by this parasitic capacitance; therefore it is important to lower the capacitance.

Accordingly, there has been proposed a circuit as described in Japanese Patent No. 3022674 (referred to below as Patent Document). In an electrostatic protection circuit shown in FIG. 3 of Patent Document, a pair of diodes is connected in series between the input/output terminal and positive power supply terminal so as for the cathode electrodes thereof to form a common connection point, and a pair of diodes is connected in series between the input/output terminal and negative power supply terminal so as for the cathode electrodes thereof to form a common connection point, whereby a lowering of the input capacitance can be implemented.

However, in the circuit configuration as shown in FIG. 3 of Patent Document, for example, when a positive surge is introduced in the input/output terminal side between the input/output terminal and negative power supply terminal, a surge can escape using the reverse breakdown current of the diode. The reverse breakdown voltage of an ordinary diode is typically about 10 V; thus, at least a voltage of 10 V is applied to the internal circuit to be protected. As the insulating film of the internal circuit becomes thinner, the protection of the internal circuit cannot be achieved with the circuit configuration of Patent Document.

In a diode, the permissible current during reverse operation is generally smaller than that during forward operation, so the discharge capacity during reverse operation in ESD (Electro-Static Discharge) is low, thereby causing a problem. Further, there is a risk that, during ordinary operation, a diode (reference number 13 of FIG. 3 in Patent Document) whose anode is connected to the input/output terminal side and whose cathode is connected to the negative power supply terminal side, is biased in a forward direction, and consequently, a signal from the input/output terminal is clamped by the diode.

SUMMARY OF THE INVENTION

An electrostatic protection circuit according to a basic configuration being an integrated circuit on a semiconductor substrate and including a first power supply terminal having a predetermined potential, a second power supply terminal having a lower potential than the predetermined potential, and an input/output terminal for a signal, the electrostatic protection circuit including: a first and second diodes having the respective cathode electrodes thereof connected in series at a first common connection point between the first power supply terminal and input/output terminal; a third and fourth diodes having the respective anode electrodes thereof connected in series at a second common connection point between the second power supply terminal and input/output terminal; a first discharge element, connected between the first and second common connection points, for discharging excessive static electricity; and a second discharge element, connected between the first and second power supply terminals, for discharging excessive static electricity.

DETAILED DESCRIPTION OF THE INVENTION

Embodiments of the electrostatic protection circuit will be described below in detail with reference to the accompanying drawings.

First Embodiment

Figure 1:
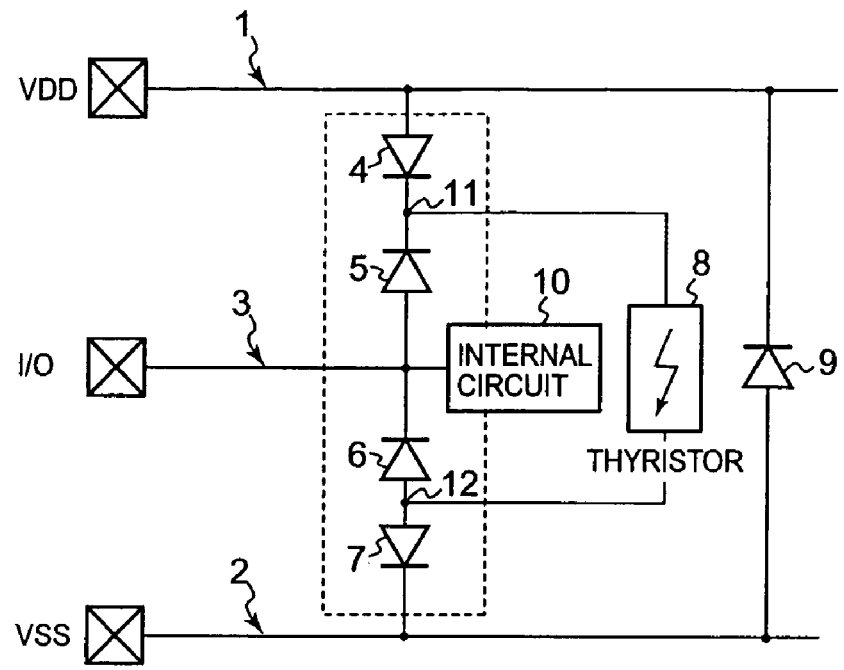
FIG. 1 is a circuit diagram showing a circuit configuration of an electrostatic protection circuit according to a first or second embodiment.

FIG. 1 is a circuit diagram showing a configuration of an electrostatic protection circuit according to a first embodiment. The electrostatic protection circuit includes a first power supply terminal 1 having a predetermined potential VDD, a second power supply terminal 2 having a lower potential VSS than the predetermined potential VDD of the first power supply terminal 1, and an input/output terminal 3 for inputting/outputting a signal. Between the first power supply terminal 1 and input/output terminal 3, there are provided a first and second diodes 4 and 5 having the respective cathodes connected in series at a first common connection point 11. Between the second power supply terminal 2 and input/output terminal 3, there are provided a third and fourth diodes 6 and 7 having the respective anodes connected in series at a second common connection point 12. Between the first common connection point 11 of the first and second diodes 4 and 5, and the second common connection point 12 of the third and fourth diodes, there is provided a thyristor 8 acting as a first discharge element. Between the first power supply terminal 1 and second power supply terminal 2, there is provided a diode 9 acting as a second discharge element. Connected to the connection point between the anode of the second diode 5 and the cathode of the third diode 6, to which the input/output terminal 3 is connected, is an internal circuit 10.

When the electrostatic protection circuit is constructed according to the first embodiment, even when a surge of any polarity (positive or negative) is introduced between any two terminals from among the three terminals 1 to 3 described in the drawing, a path for discharging the surge can be configured using the forward characteristics of the diode and the current voltage characteristics of the thyristor. The forward threshold voltage of the diode is typically about 1 V, and the clamp voltage of the thyristor can be made approximately equal to that value of the diode. Accordingly, in the configuration of the first embodiment, the voltage applied to the internal circuit is approximately 4 V, and can thus be suppressed to half or less than that of a case when the reverse characteristics of the diode is used. In addition, the forward characteristics of the diode with a large permissible current are used, so the size of the diode can be reduced, whereby the input capacitance of the input/output terminal 3 can be lowered.

Figure 2:
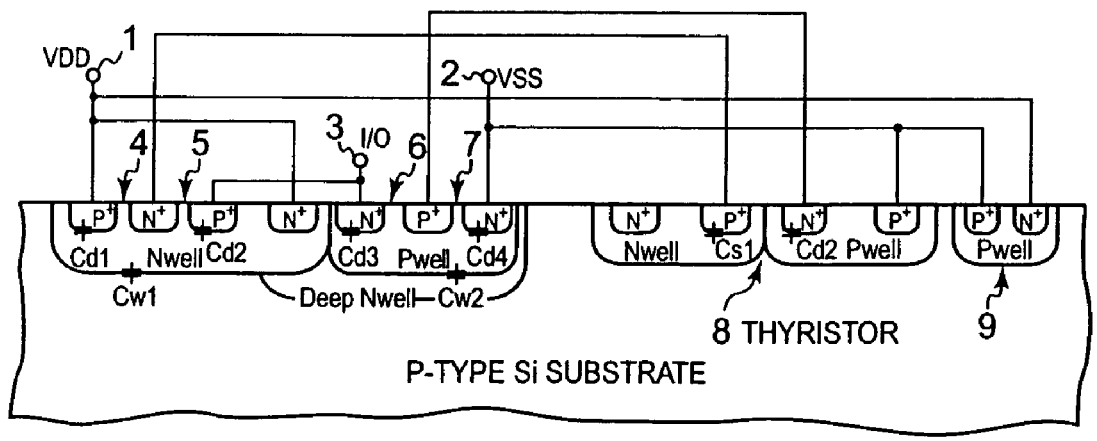
FIG. 2 is a sectional view showing a sectional configuration of the electrostatic protection circuit according to the first embodiment.

FIG. 2 is a sectional view of the electrostatic protection circuit according to the first embodiment, showing a sectional configuration in which the first to fourth diodes 4 to 7 are formed on a substrate of P-type silicon (Si) in the left side of the drawing, and the thyristor 8 acting as the first discharge element and the diode 9 acting as the second discharge element are formed in the right side of the drawing. A parasitic capacitance "C1" seen from the input/output terminal 3 can be calculated from the junction capacitance of the diode and the junction capacitance between the common connection point of the diode and the power supply terminal, so "C1" is expressed as the following formula. An input capacitance "C2" seen from the input/output terminal 3 in the conventional circuit configuration described in Patent Document is expressed as the following formula. Accordingly, it can be seen that, by employing the configuration of the first embodiment, the input capacitance of the input/output terminal 3 can be lowered.

$$C1 = Cd2(Cd1+Cw1+Cs1)/(Cd1+Cd2+Cw1+Cs1)+Cd3(Cd4+Cw2+Cs2)/(Cd3+Cd4+Cw2+Cs2)$$

$$C2 = Cd2+Cd3$$

FIG. 2 shows an example in which the diodes are formed in a Si substrate. However, the diodes may be formed in a polysilicon (Si) layer etc. deposited on a P-type Si substrate via an insulating film (refer to a seventh embodiment of FIG. 18). In this case, the junction capacitance between the common connection point of the diode and the power supply terminal is eliminated, so the input capacitance of the input/output terminal can be further lowered. When the potential of a signal supplied to the input/output terminal 3 has a value between the potential of the first power supply terminal 1 and the potential of the second power supply terminal 2, the diodes cannot be biased in a forward direction during an ordinary operation. Accordingly, there is no risk that the potential of the signal is clamped by the diodes.

Figure 3:
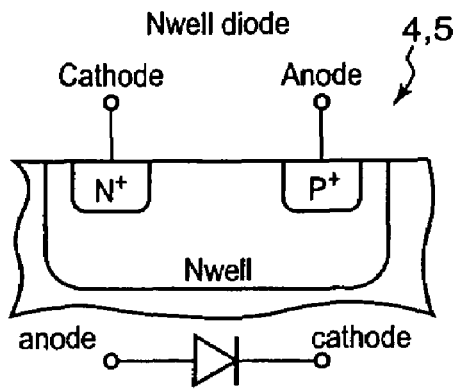
FIG. 3 is a sectional view showing a sectional configuration of an element used in first to tenth embodiments.
Figure 4:
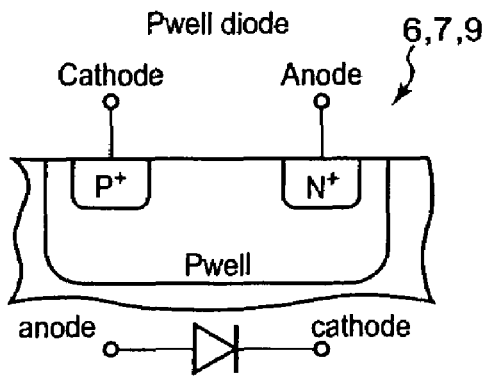
FIG. 4 is a sectional view showing a sectional configuration of an element used in first to tenth embodiments.
Figure 5:
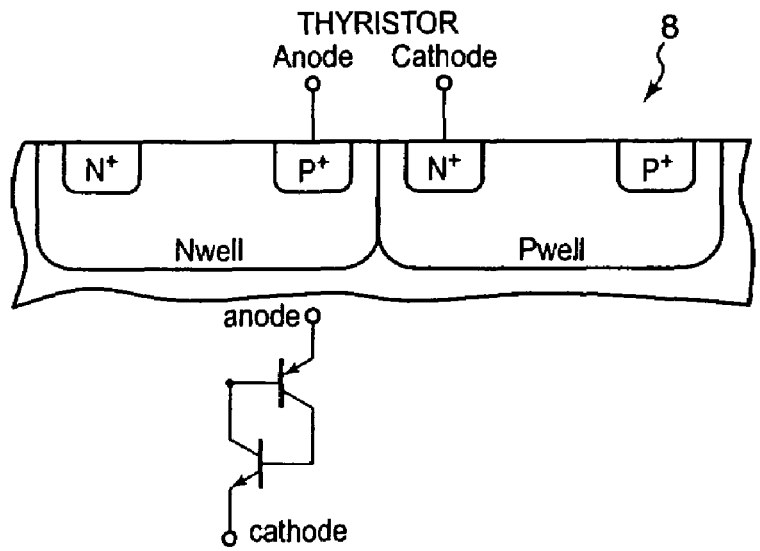
FIG. 5 is a sectional view showing a sectional configuration of an element used in first to tenth embodiments.
Figure 6:
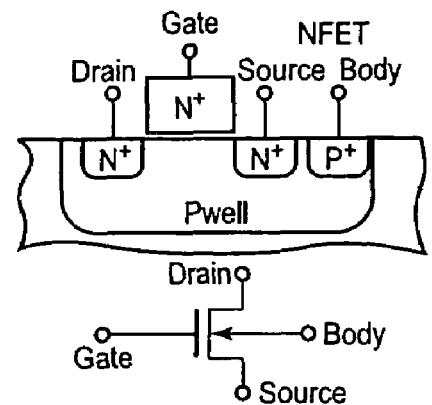
FIG. 6 is a sectional view showing a sectional configuration of an element used in first to tenth embodiments.
Figure 7:
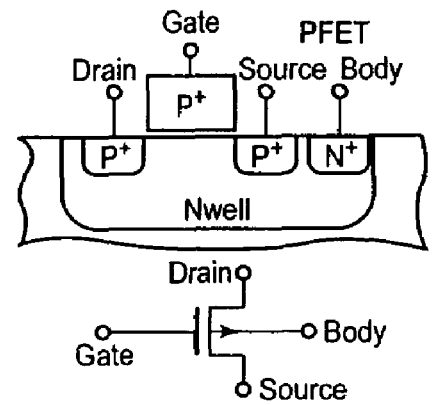
FIG. 7 is a sectional view showing a sectional configuration of an element used in first to tenth embodiments.
Figure 8:
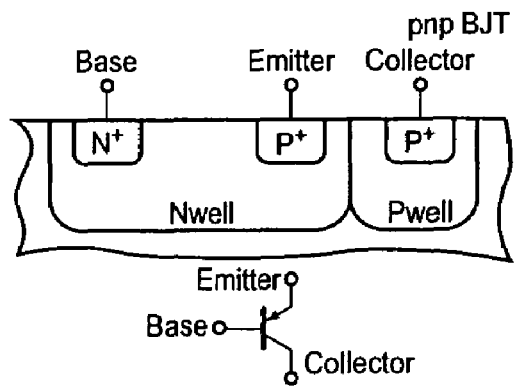
FIG. 8 is a sectional view showing a sectional configuration of an element used in first to tenth embodiments.
Figure 9:
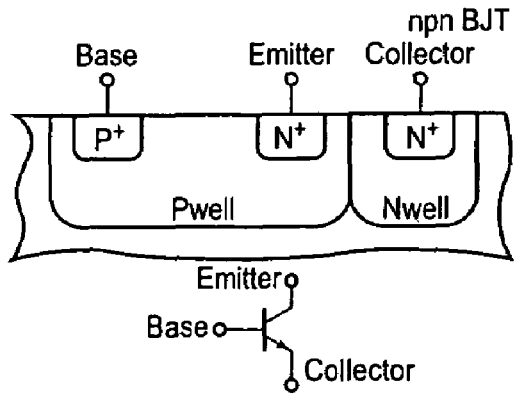
FIG. 9 is a sectional view showing a sectional configuration of an element used in first to tenth embodiments.

The thyristor 8 used as the first discharge element and the diode 9 used as the second discharge element shown in the sectional view of FIG. 2 have specific configurations shown in FIGS. 3 to 5, respectively. FIG. 3 shows a diode formed in an Nwell region with the anode and cathode electrodes thereof as shown in the drawing; shown below the sectional view is the corresponding circuit diagram. FIG. 4 shows a diode formed in a Pwell region with the anode and cathode electrodes thereof as shown in the drawing; shown below the sectional view is the corresponding circuit diagram. FIG. 5 shows a thyristor formed in an Nwell and Pwell regions with the anode and cathode electrodes thereof shown in the drawing; shown below the sectional view is the corresponding circuit diagram.

In the description of the first embodiment, the first and second discharge elements are formed by use of the thyristor 8 and diode 9. However, as shown in FIGS. 6 to 9, the first and second discharge elements may be constituted of an N-type FET (FIG. 6), P-type FET (FIG. 7), PNP-type Bipolar Junction Transistor (referred to below as BJT) (refer to FIG. 8), or NPN-type BJT (refer to FIG. 9). In FIGS. 6 to 9, the sectional configurations of the elements are shown, respectively, and at the same time, the circuit configurations corresponding to the sectional configurations are also shown below the sectional configurations, respectively.

The electrostatic protection circuit is not limited to that of the first embodiment, and various modifications thereto are possible. The electrostatic protection circuit according to second to tenth embodiments will be described below.

Second Embodiment

Figure 10:
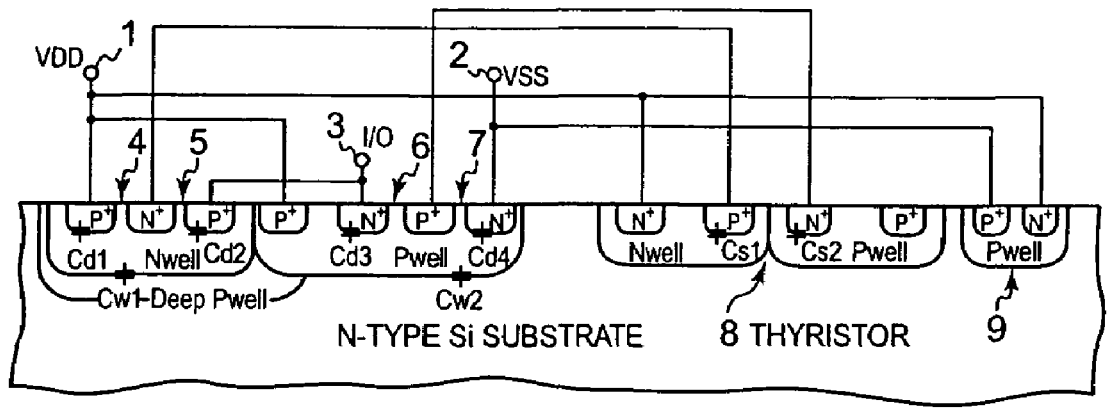
FIG. 10 is a sectional view showing a sectional configuration of the electrostatic protection circuit according to the second embodiment.

In the description of the first embodiment, the sectional configuration of the electrostatic protection circuit is formed in a Pwell silicon substrate as shown in FIG. 2. However, the electrostatic protection circuit according to the second embodiment is formed in an Nwell silicon substrate as shown in FIG. 10. The circuit configuration is similar to that of FIG. 1, and hence repeated explanation thereof is omitted here. In the second embodiment shown in FIG. 10, also, a pair of diodes 4 and 5 with the cathodes connected to each other, and a pair of diodes 6 and 7 with the anodes connected to each other are formed in the left side of the drawing; the thyristor 8 acting as the first discharge element, and the diode 9 acting as the second discharge element are formed in the right side of the drawing.

The difference between the first and second embodiments lies in whether the silicon substrate is a P type or N type, and also lies in that, while a deep Nwell region is formed below the third and fourth diodes 6 and 7 formed in a Pwell in the first embodiment, a deep Pwell region is formed below the first and second diodes 4 and 5 formed in a Nwell in the second embodiment. In other aspects, the configuration of the second embodiment is identical to that of the first embodiment. A parasitic capacitance "C1" seen from the input/output terminal 3 of FIG. 10, and a parasitic capacitance "C2" seen from the input/output terminal 3 in the configuration of FIG. 1 are expressed as formulas similar to those in the first embodiment. Thus, repeated explanation thereof is omitted here.

Third and Fourth Embodiments

The third and fourth embodiments, which are variations of the first and second embodiments, will now be described. The difference between the third and fourth embodiments lies only in whether the substrate on which the elements are formed is a P-type silicon substrate or an N-type silicon substrate, similarly to the difference between the first and second embodiments. Accordingly, the circuit configuration of the third embodiment and that of the fourth embodiment are shown as the same circuit diagram as shown in FIG. 11.

Figure 11:
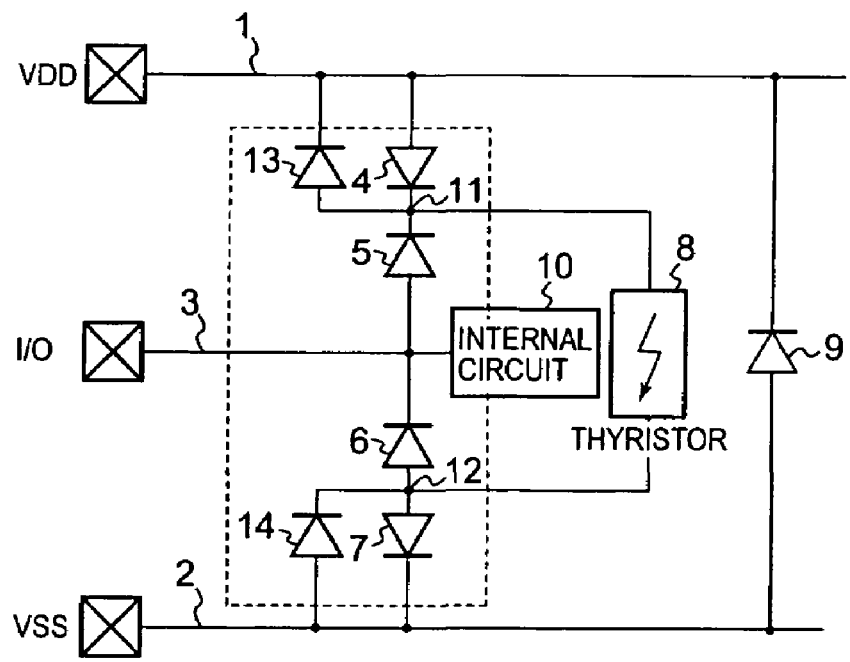
FIG. 11 is a circuit diagram showing a circuit configuration of an electrostatic protection circuit according to the third or fourth embodiment.

As shown in FIG. 11, in addition to the circuit shown in FIG. 1, the electrostatic protection circuit according to the third or fourth embodiment further includes a fifth diode 13 having the anode electrode connected to the first common connection point 11 and the cathode electrode connected to the first power supply terminal 1, and a sixth diode 14 having an anode electrode connected to the second power supply terminal 2 and a cathode electrode connected to the second common connection point 12.

Figure 12:
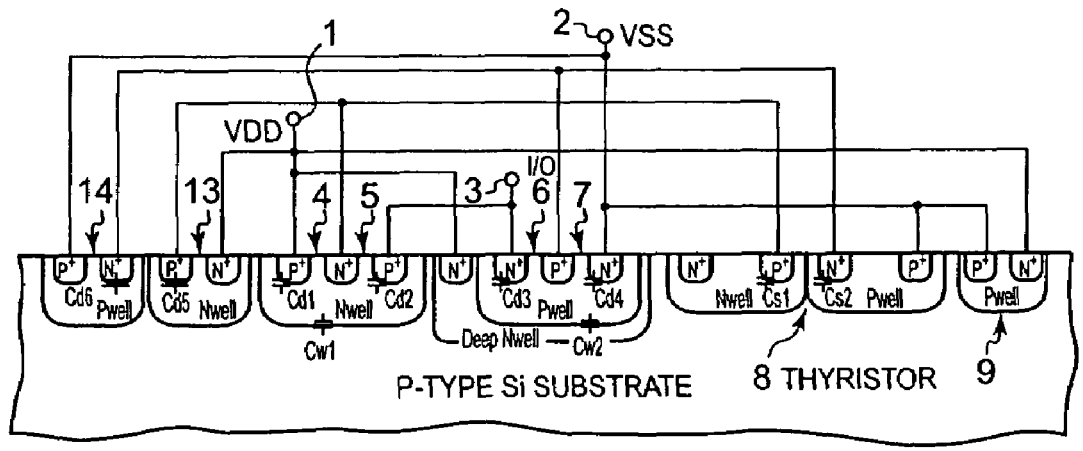
FIG. 12 is a sectional view showing a sectional configuration of the electrostatic protection circuit according to the third embodiment.

As shown in a sectional view of FIG. 12, the electrostatic protection circuit according to the third embodiment is formed in a P-type silicon substrate; the first and second diodes 4 and 5, and the third and fourth diodes 6 and 7 are formed in the central section of the drawing similarly to FIG. 2; the thyristor 8 acting as the first discharge element, and the diode 9 acting as the second discharge element are formed in the right side of the drawing similarly to FIG. 2; the fifth and sixth diodes 13 and 14 are formed in the left side of the drawing. The fifth and sixth diodes 13 and 14 are added to the configuration of FIG. 2.

FIG. 11 is the circuit diagram of the third or fourth embodiment, which includes the first power supply terminal 1, second power supply terminal 2 having a lower potential than the first power supply terminal 1, and the input/output terminal 3. In the drawing, the first and second diodes 4 and 5 are connected in series between the first power supply terminal 1 and input/output terminal 3 so as for the cathodes electrodes thereof to form the first common connection point 11; the third and fourth diodes 6 and 7 are connected in series between the second power supply terminal 2 and input/output terminal 3 so as for the anode electrodes thereof to form the second common connection point 12; the thyristor 8 is connected between the first common connection point 11 of the first and second diodes 4 and 5, and the second common connection point 12 of the third and fourth diodes 6 and 7; the anode electrode of the fifth diode 13 is connected to the first common connection point 11 of the first and second diodes 4 and 5, and the cathode electrode is connected to the first power supply terminal 1; the cathode electrode of the sixth diode 14 is connected to the second common connection point 12 of the third and fourth diodes 6 and 7, and the anode electrode is connected to the second power supply terminal 2; the diode 9 acting as the second discharge element is connected between the first power supply terminal 1 and second power supply terminal 2.

When the circuit configuration according to the third or fourth embodiment is employed, even when a surge of any polarity (positive or negative) is introduced between any two terminals in the drawing, a path for discharging the surge can be configured using the forward characteristics of the diode and the current voltage characteristics of the thyristor. The forward threshold voltage of the diode is typically about 1 V, and the clamp voltage of the thyristor can be made approximately equal to that value of the diode. Accordingly, in the configuration of the third or fourth embodiment, the voltage applied to the internal circuit 10 is approximately 3 V, and can thus be suppressed to half or less than that of a case when the reverse characteristics of the diode is used; the voltage can be further suppressed by approximately 1 V relative to the first embodiment.

FIG. 12 shows a sectional view of the circuit of FIG. 11. The parasitic capacitance seen from the input/output terminal 3 can be calculated from the junction capacitance of the diode and the junction capacitance between the common connection point of the diode and power supply terminal, and is expressed as "C4" described below. "C4" is larger than the input capacitance of the first or second embodiment; however, "C4" can be lowered relative to the conventional input capacitance "C2". In addition, the forward characteristics of the diode with a large permissible current are used, so the size of the diode can be reduced, whereby the input capacitance of the input/output terminal 3 can be lowered.

$$C4=Cd2\times(Cd1+Cw1+Cs1+Cd5)/(Cd1+Cd2+Cw1+Cs1+Cd5)+Cd3\times(Cd4+Cw2+Cs2+Cd6)/(Cd3+Cd4+Cw2+Cs2+Cd6)$$

When the potential of a signal supplied to the input/output terminal 3 has a value between the potential of the first power supply terminal 1 and the potential of the second power supply terminal 2, the diodes cannot be biased in a forward direction during an ordinary operation. Accordingly, there is no risk that the potential of the signal is clamped by the diodes.

Figure 13:
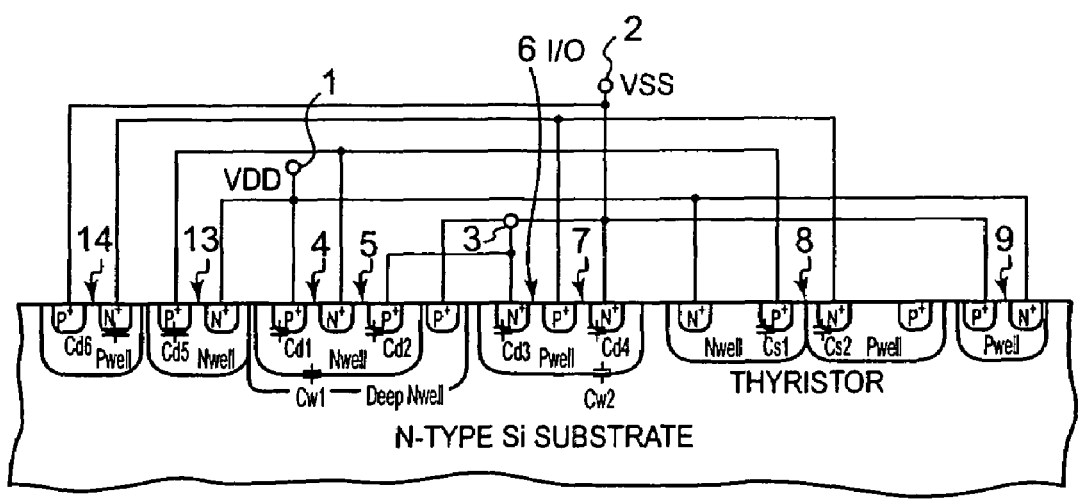
FIG. 13 is a sectional view showing a sectional configuration of the electrostatic protection circuit according to the fourth embodiment.

The fourth embodiment has the same circuit configuration as the third embodiment. The difference from the third embodiment lies in that the electrostatic protection circuit formed on a P-type silicon substrate in the third embodiment is formed on an N-type silicon substrate. Thus, only the sectional configuration of FIG. 13 is different from that of the third embodiment. The circuit configuration of FIG. 11 is the same as that of the third embodiment, and hence repeated explanation thereof is omitted here.

Referring to the sectional view of the fourth embodiment shown in FIG. 13, between an N-type silicon substrate and an Nwell region in which the first and second diodes 4 and 5 are formed, there is provided a deep Pwell region; the difference from the third embodiment lies in that the deep Nwell region of the third embodiment shown in FIG. 12 is not provided in a Pwell region in which the third and fourth diodes 6 and 7 are formed.

Fifth Embodiment

Figure 14:
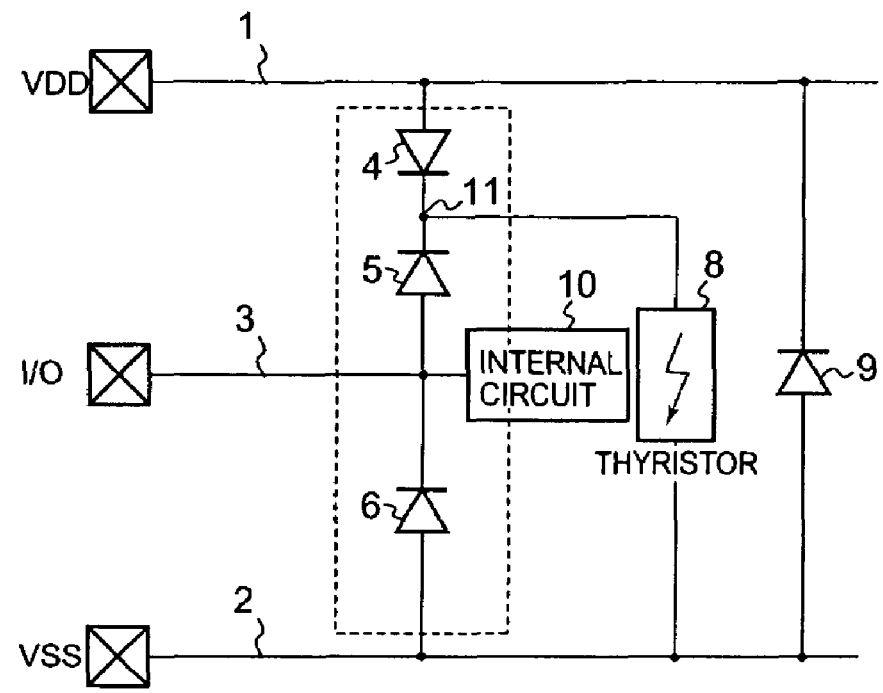
FIG. 14 is a circuit diagram showing a sectional configuration of an electrostatic protection circuit according to the fifth embodiment.

An electrostatic protection circuit according to the fifth embodiment will now be described with reference to FIG. 14. FIG. 14 is a circuit diagram of the fifth embodiment. According to the fifth embodiment, an integrated circuit on a P-type semiconductor substrate includes the first power supply terminal 1, second power supply terminal 2 having a lower potential than the first power supply terminal 1, and the input/output terminal 3; the first and second diodes 4 and 5 are connected in series between the first power supply terminal 1 and input/output terminal 3 so as for the cathodes electrodes thereof to form the first common connection point 11; the anode electrode of the third diode 6 is connected to the second power supply terminal 2, and the cathode electrode is connected to the input/output terminal 3; the thyristor 8 is connected between the first common connection point 11 of the first and second diodes 4 and 5, and the second power supply terminal 2; the diode 9 is connected between the first power supply terminal 1 and second power supply terminal 2.

When the circuit configuration according to the fifth embodiment is employed, even when a surge of any polarity (positive or negative) is introduced between any two terminals in the drawing, a path for discharging the surge can be configured using the forward characteristics of the diode and the current voltage characteristics of the thyristor. The forward threshold voltage of the diode is typically about 1 V, and the clamp voltage of the thyristor 8 can be made approximately equal to that value of the diode. Accordingly, in the present configuration, the voltage applied to the internal circuit 10 is approximately 3 V, and can thus be suppressed to half or less than that of a case when the reverse characteristics of the diode is used; the voltage can be further suppressed by approximately 1 V relative to the first embodiment. In addition, the forward characteristics of the diode with a large permissible current are used, so the size of the diode can be reduced, whereby the input capacitance of the input/output terminal 3 can be lowered.

Figure 15:
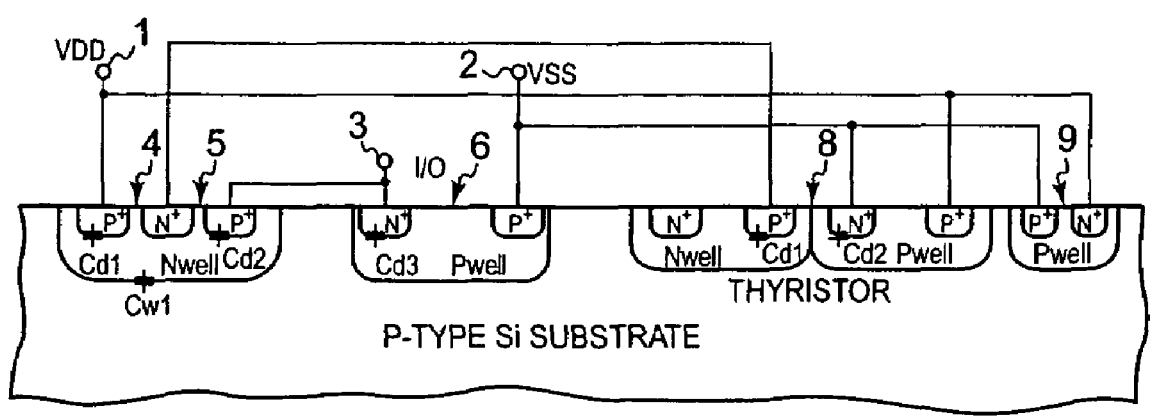
FIG. 15 is a sectional view showing a sectional configuration of the electrostatic protection circuit according to the fifth embodiment.

FIG. 15 is a sectional view of the circuit shown in FIG. 14. The parasitic capacitance seen from the input/output terminal 3 can be calculated from the junction capacitance of the diode and the junction capacitance between the common connection point of the diode and power supply terminal, and is expressed as "C3" described below. "C3" is larger than the input capacitance "C1" of the first embodiment; however, "C3" can be lowered relative to the conventional input capacitance "C2" described in Patent Document. In addition, in the configuration of the first embodiment shown in FIG. 2, in order to separate the second common connection point 12 of the anode electrodes of the third and fourth diodes from the silicon (Si) substrate, the deep Nwell is required; in the configuration of the fifth embodiment, however, the deep Nwell needs not be provided.

$$C3 = Cd2 \times (Cd1 + Cw1 + Cs1)/(Cd1 + Cd2 + Cw1 + Cs1) + Cd3$$

FIG. 15 shows a configuration in which the diodes are formed in a P-type silicon substrate. However, the diodes may be formed in a polysilicon (Si) layer etc. deposited on a silicon substrate via an insulating film. In this case, the junction capacitance between the common connection point of the diode and the power supply terminal is eliminated, so the input capacitance can be further lowered. When the potential of a signal supplied to the input/output terminal 3 has a value between the potential of the first power supply terminal 1 and the potential of the second power supply terminal 2, the diodes cannot be biased in a forward direction during an ordinary operation. Accordingly, there is no risk that the potential of the signal is clamped by the diodes.

In the electrostatic protection circuit according to the fifth embodiment shown in FIGS. 14 and 15, the first and second diodes 4 and 5 having the anode electrodes thereof connected at the first common connection point 11 are formed on the P-type silicon substrate, and the only diode provided between the second power supply terminal 2 and input/output terminal 3 is the third diode 6. However, as in the sixth embodiment described below, the diodes may be formed on an N-type silicon substrate.

Sixth Embodiment

Figure 16:
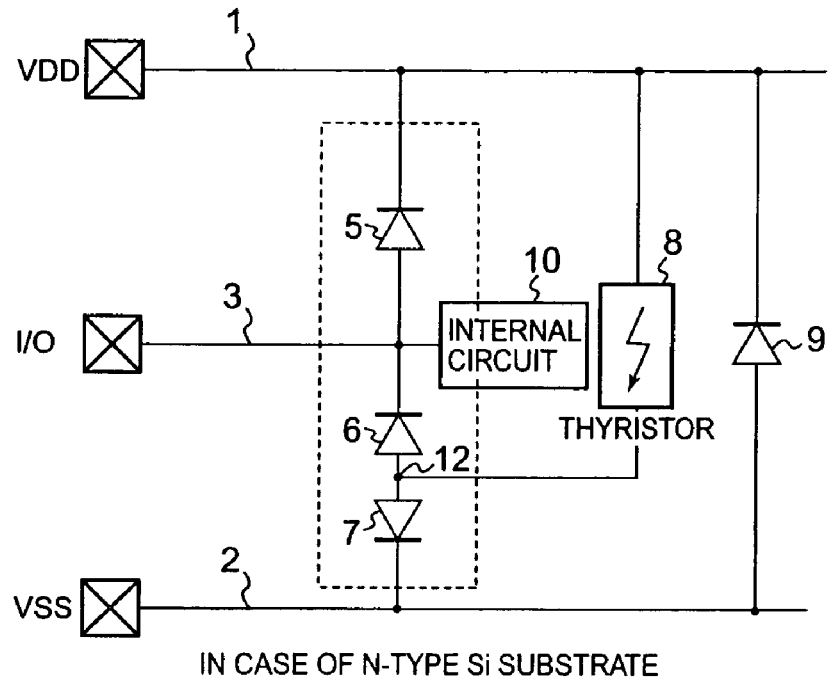
FIG. 16 is a circuit diagram showing a circuit configuration of an electrostatic protection circuit according to the sixth embodiment.
Figure 17:
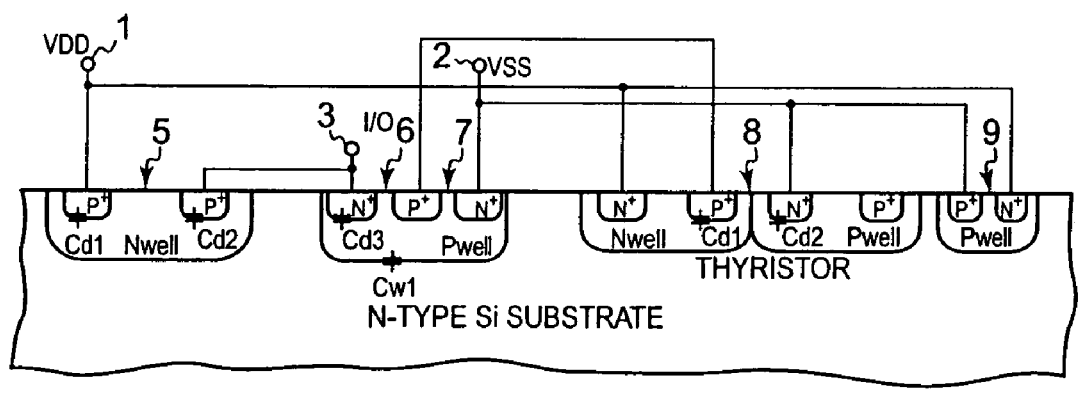
FIG. 17 is a sectional view showing a sectional configuration of the electrostatic protection circuit according to the sixth embodiment.

As shown in a circuit diagram of FIG. 16 and a sectional view of FIG. 17, an electrostatic protection circuit according to the sixth embodiment is an integrated circuit on an N-type semiconductor substrate, and includes the first power supply terminal 1 having a predetermined potential, second power supply terminal 2 having a lower potential than the predetermined potential, and the input/output terminal 3. The configuration includes: one diode 5 having the cathode electrode thereof connected to the first power supply terminal 1, and the anode electrode thereof connected to the input/output terminal 3; a pair of diodes 6 and 7 having the respective cathode electrodes connected in series at the common connection point 12 between the input/output terminal 3 and second power supply terminal 2; the thyristor 8 acting as the first discharge element, connected between the first power supply terminal 1 and the common connection point 12, for discharging excessive static electricity; and the diode 9 acting as the second discharge element, connected between the first power supply terminal 1 and second power supply terminal 2, for discharging excessive static electricity.

As shown in FIG. 17, the sectional configuration of the electrostatic protection circuit according to the sixth embodiment includes: one diode 5 formed in an Nwell region of an N-type silicon substrate; a pair of diodes 6 and 7 formed in a Pwell region; the thyristor 8 acting as the first discharge element, formed extending across a Nwell region and Pwell region; and the diode 9 acting as the second discharge element, formed in a Pwell region.

By forming the diodes 5 to 7 and 9, and thyristor 8 in the N-type silicon substrate having the sectional configuration as shown in FIG. 17, the electrostatic protection circuit as shown in the circuit diagram of FIG. 16 can be configured.

In the above described embodiments, the first to fourth diodes 4 to 7 are each configured of a bipolar transistor. The electrostatic protection circuit, however, is not limited to this configuration; the diodes may be each configured of a MOSFET formed on a P-type or N-type silicon substrate via an insulating film. This will be described below according to the seventh to tenth embodiments with reference to the drawings.

Seventh Embodiment

Figure 18:
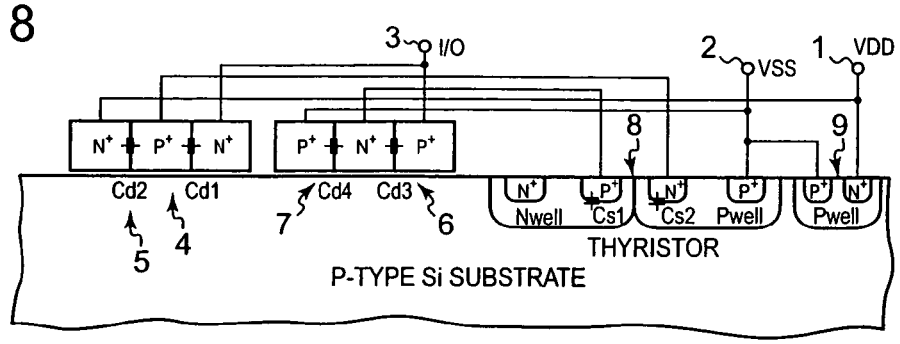
FIG. 18 is a sectional view showing a sectional configuration of an electrostatic protection circuit according to the seventh embodiment.

In FIG. 18 of the seventh embodiment, there is shown a configuration in which the BJT having the sectional configuration shown in FIG. 2 is replaced with a MOSFET. Accordingly, the circuit configuration is identical to that of FIG. 1 used for the first embodiment, and hence repeated explanation thereof is omitted.

As shown in FIG. 18, the first to fourth diodes 4 to 7 are each configured of a MOSFET formed in a semiconductor which is deposited on a P-type silicon substrate via an insulating film. In the drawing, the insulating film is omitted to be shown; it is illustrated as a gap. In this case, the junction capacitance between the common connection point of diodes and the power supply terminal is eliminated, whereby the input capacitance of the input/output terminal can be further lowered.

Eighth Embodiment

Figure 19:
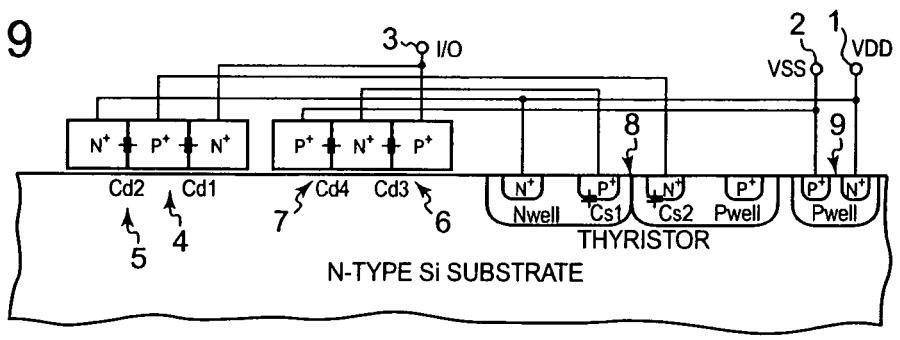
FIG. 19 is a sectional view showing a sectional configuration of an electrostatic protection circuit according to the eighth embodiment.

In FIG. 19 of the eighth embodiment, there is shown a configuration in which the BJT having the sectional configuration shown in FIG. 10 is replaced with a MOSFET. Accordingly, the circuit configuration is identical to that of FIG. 1 used for the first embodiment, and hence repeated explanation thereof is omitted.

As shown in FIG. 19, the first to fourth diodes 4 to 7 are each configured of a MOSFET formed in a semiconductor which is deposited on an N-type silicon substrate via an insulating film. In the drawing, the insulating film is omitted to be shown; it is illustrated as a gap. In this case, the junction capacitance between the common connection point of diodes and the power supply terminal is eliminated, whereby the input capacitance of the input/output terminal can be further lowered.

Ninth Embodiment

Figure 20:
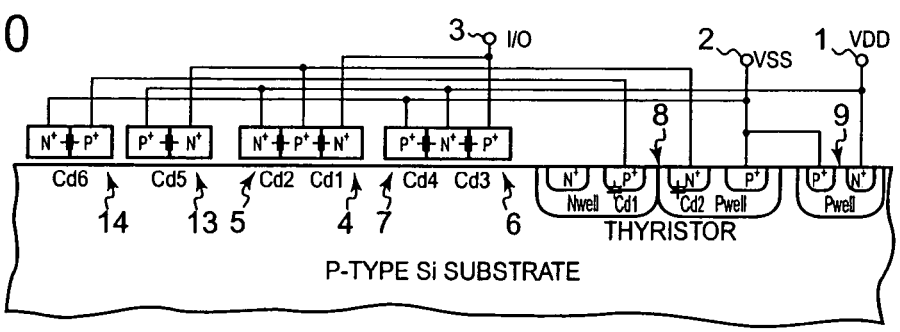
FIG. 20 is a sectional view showing a sectional configuration of an electrostatic protection circuit according to the ninth embodiment.

In FIG. 20 of the ninth embodiment, there is shown a configuration in which the BJT having the sectional configuration shown in FIG. 12 is replaced with a MOSFET. Accordingly, the circuit configuration is identical to that of FIG. 11 used for the third embodiment, and hence repeated explanation thereof is omitted.

As shown in FIG. 20, the first to sixth diodes 4 to 7, 13 and 14 are each configured of a MOSFET formed in a semiconductor which is deposited on a P-type silicon substrate via an insulating film. In the drawing, the insulating film is omitted to be shown; it is illustrated as a gap. In this case, the junction capacitance between the common connection point of diodes and the power supply terminal is eliminated, whereby the input capacitance of the input/output terminal can be further lowered.

Tenth Embodiment

Figure 21:
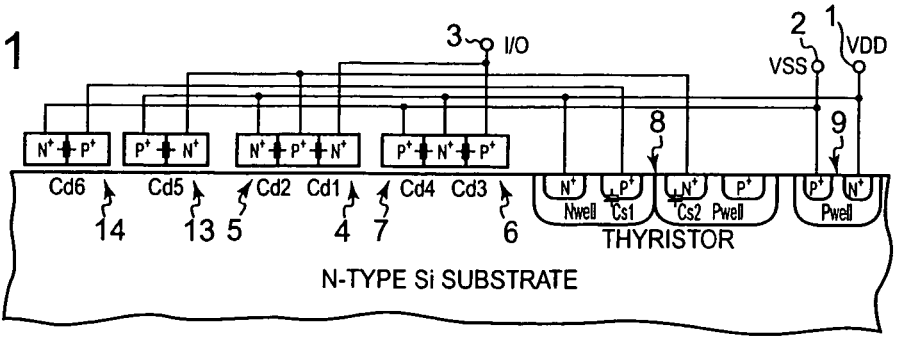
FIG. 21 is a sectional view showing a sectional configuration of an electrostatic protection circuit according to the tenth embodiment.

In FIG. 21 of the tenth embodiment, there is shown a configuration in which the BJT having the sectional configuration shown in FIG. 13 is replaced with a MOSFET. Accordingly, the circuit configuration is identical to that of FIG. 11 used for the third embodiment, and hence repeated explanation thereof is omitted.

As shown in FIG. 21, the first to sixth diodes 4 to 7, 13 and 14 are each configured of a MOSFET formed in a semiconductor which is deposited on an N-type silicon substrate via an insulating film. In the drawing, the insulating film is omitted to be shown; it is illustrated as a gap. In this case, the junction capacitance between the common connection point of diodes and the power supply terminal is eliminated, whereby the input capacitance of the input/output terminal can be further lowered.

Though omitted to be shown, in the fifth embodiment described with reference to FIGS. 14 and 15, also, the first to third diodes 4 to 6 may be each configured of a MOSFET formed on a P-type silicon substrate via an insulating film, instead of forming them with a BJT. In the sixth embodiment described with reference to FIGS. 16 and 17, also, the one diode 5 in the VDD side, and the pair of diodes 6 and 7 in the VSS side may be configured of a MOSFET formed on an N-type silicon substrate via an insulating film, instead of forming them with a BJT. In this case, the junction capacitance between the common connection point of diodes and the power supply terminal is eliminated, whereby the input capacitance of the input/output terminal can be further lowered.

As described above, in accordance with the above described electrostatic protection circuit in the above embodiments, the input capacitance in the input/output terminal can be lowered, and at the same time, a voltage applied to the internal circuit by a surge can be suppressed, whereby a high-performance protection circuit with a low input capacitance can be realized.

What is claimed is:

1. An electrostatic protection circuit being an integrated circuit on a semiconductor substrate and including a first power supply terminal having a predetermined potential, a second power supply terminal having a lower potential than the predetermined potential, and an input/output terminal for a signal, the electrostatic protection circuit comprising:
   first and second diodes having respective cathode electrodes thereof connected in series at a first common connection point between the first power supply terminal and the input/output terminal;
   third and fourth diodes having respective anode electrodes thereof connected in series at a second common connection point between the second power supply terminal and the input/output terminal;
   a first discharge element, connected between the first and second common connection points, for discharging excessive static electricity; and
   a second discharge element, connected between the first and second power supply terminals, for discharging excessive static electricity,
   wherein both of the first and second common connection points are internal intermediate nodes to which potential is internally supplied directly in the electrostatic protection circuit and is not externally supplied directly from outside of the electrostatic protection circuit, and
   wherein the internal intermediate nodes are not directly electrically connected with an internal circuit which the electrostatic protection circuit protects.

2. The electrostatic protection circuit according to claim 1, wherein at least one of the first and second discharge elements is any one of a diode, thyristor, MOSFET and bipolar transistor.

3. The electrostatic protection circuit according to claim 1, wherein the first discharge element is a thyristor, and the second discharge element is a diode.

4. The electrostatic protection circuit according to claim 1, wherein the semiconductor substrate is a P-type silicon substrate.

5. The electrostatic protection circuit according to claim 1, wherein the semiconductor substrate is an N-type silicon substrate.

6. The electrostatic protection circuit according to claim 1, wherein the first to fourth diodes are each a BJT.

7. The electrostatic protection circuit according to claim 1, wherein the first to fourth diodes are each a MOSFET.

8. The electrostatic protection circuit according to claim 1, further comprising; a fifth diode having an anode electrode connected to the first common connection point and a cathode electrode connected to the first power supply terminal; and a sixth diode having an anode electrode connected to the second power supply terminal and a cathode electrode connected to the second common connection point.

9. The electrostatic protection circuit according to claim 8, wherein at least one of the first and second discharge elements is any one of a diode, thyristor, MOSFET and bipolar transistor.

10. The electrostatic protection circuit according to claim 8, wherein the first discharge element is a thyristor, and the second discharge element is a diode.

11. The electrostatic protection circuit according to claim 8, wherein the semiconductor substrate is a P-type silicon substrate.

12. The electrostatic protection circuit according to claim 8, wherein the semiconductor substrate is an N-type silicon substrate.

13. The electrostatic protection circuit according to claim 8, wherein the first to fourth diodes are each a BJT.

14. The electrostatic protection circuit according to claim 8, wherein the first to fourth diodes are each a MOSFET.

15. An electrostatic protection circuit being an integrated circuit on a P-type semiconductor substrate and including a first power supply terminal having a predetermined potential, a second power supply terminal having a lower potential than the predetermined potential, and an input/output terminal, the electrostatic protection circuit comprising:
  first and second diodes having respective cathode electrodes thereof connected in series at a common connection point between the first power supply terminal and input/output terminal;
  a third diode having an anode electrode connected to the second power supply terminal and a cathode electrode connected to the input/output terminal,
  a first discharge element, connected between the common connection point as a first connection point and a second connection point which is connected to the second power supply terminal through a connection point between the second power supply terminal and the anode electrode of the third diode, for discharging excessive static electricity; and
  a second discharge element, connected between the first and second power supply terminals, for discharging excessive static electricity,
  wherein the second connection point is positioned between a connection point between the second power supply terminal and the anode electrode of the third diode, and a connection point between the second power supply terminal and the second discharge element,
  wherein the common connection point as the first connection point is an internal intermediate node to which potential is internally supplied directly in the electrostatic protection circuit and is not externally supplied directly from outside of the electrostatic. protection circuit, and
  wherein the internal intermediate node is not directly electrically connected with an internal circuit which the electrostatic protection circuit protects.

16. The electrostatic protection circuit according to claim 15, wherein at least one of the first and second discharge elements is any one of a diode, thyristor, MOSFET and bipolar transistor.

17. The electrostatic protection circuit according to claim 15, wherein the first discharge element is a thyristor, and the second discharge element is a diode.

18. An electrostatic protection circuit being an integrated circuit on a N-type semiconductor substrate and including a first power supply terminal having a predetermined potential, a second power supply terminal having a lower potential than the predetermined potential, and an input/output terminal, the electrostatic protection circuit comprising:
  one diode having a cathode electrode connected to the first power supply terminal and having an anode electrode connected to the input/output terminal;
  a pair of diodes having respective cathode electrodes thereof connected in series at a common connection point between the input/output terminal and the second power supply terminal;
  a first discharge element, connected between a first connection point connected to the first power supply terminal and the common connection point as a second connection point for discharging excessive static electricity; and
  a second discharge element, connected between the first and second power supply terminals, for discharging excessive static electricity,
  wherein the first connection point is positioned between a connection point between the first power supply terminal and the cathode electrode of the one diode, and a connection point between the first power supply terminal and the second discharge element,
  wherein the common connection point as the second connection point is an internal intermediate node to which potential is internally supplied directly in the electrostatic protection circuit and is not externally supplied directly from an outside of the electrostatic protection circuit, and
  wherein the internal intermediate node is not directly electrically connected with an internal circuit which the electrostatic protection circuit protects.

19. The electrostatic protection circuit according to claim 18, wherein at least one of the first and second discharge elements is any one of a diode, thyristor, MOSFET and bipolar transistor.

20. The electrostatic protection circuit according to claim 18, wherein the first discharge element is a thyristor, and the second discharge element is a diode.

* * * * *